United States Patent
Meiser et al.

(10) Patent No.: US 10,453,915 B2
(45) Date of Patent: Oct. 22, 2019

(54) SEMICONDUCTOR DEVICE HAVING A FIELD ELECTRODE AND A GATE ELECTRODE IN A TRENCH STRUCTURE AND MANUFACTURING METHOD

(71) Applicant: Infineon Technologies AG, Neubiberg (DE)

(72) Inventors: Andreas Meiser, Sauerlach (DE);
Karl-Heinz Bach, Groebenzell (DE);
Christian Kampen, Munich (DE);
Dietmar Kotz, Villach (AT); Andrew Christopher Graeme Wood, St. Jakob im Rosental (AT); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/941,637

(22) Filed: Mar. 30, 2018

(65) Prior Publication Data
US 2018/0286944 A1 Oct. 4, 2018

(30) Foreign Application Priority Data
Mar. 31, 2017 (DE) .................. 10 2017 107 020

(51) Int. Cl.
| | |
|---|---|
| *H01L 29/06* | (2006.01) |
| *H01L 29/40* | (2006.01) |
| *H01L 29/10* | (2006.01) |
| *H01L 29/78* | (2006.01) |
| *H01L 29/66* | (2006.01) |

(Continued)

(52) U.S. Cl.
CPC ........ *H01L 29/0619* (2013.01); *H01L 21/266* (2013.01); *H01L 29/0615* (2013.01); *H01L 29/0696* (2013.01); *H01L 29/1095* (2013.01); *H01L 29/36* (2013.01); *H01L 29/407* (2013.01); *H01L 29/66734* (2013.01);
(Continued)

(58) Field of Classification Search
CPC . H01L 51/56; H01L 51/5012; H01L 51/5056; H01L 51/5072; H01L 51/0097
USPC ........................................... 257/330
See application file for complete search history.

(56) References Cited

U.S. PATENT DOCUMENTS

| | | | |
|---|---|---|---|
| 2008/0042172 A1* | 2/2008 | Hirler | H01L 29/0623 257/288 |
| 2014/0306284 A1* | 10/2014 | Mauder | H01L 29/105 257/330 |

FOREIGN PATENT DOCUMENTS

DE 102006036347 B4 1/2012

* cited by examiner

*Primary Examiner* — Andy Huynh
(74) *Attorney, Agent, or Firm* — Murphy, Bilak & Homiller, PLLC (57) ABSTRACT

A semiconductor device includes a semiconductor body having a semiconductor substrate of a first conductivity type and a semiconductor layer of the first conductivity type on the substrate. A trench structure extends into the semiconductor body from a first surface and includes a gate electrode and at least one field electrode arranged between the gate electrode and a bottom side of the trench structure. A body region adjoins the trench structure and laterally extends from a transistor cell area into an edge termination area. A pn junction is between the body region and semiconductor layer. A doping concentration of at least one of the body region and semiconductor layer is lowered at a lateral end of the pn junction in the edge termination area compared to a doping concentration of the at least one of the body region and semiconductor layer at the pn junction in the transistor cell area.

22 Claims, 8 Drawing Sheets

(51) Int. Cl.
*H01L 21/266* (2006.01)
*H01L 29/36* (2006.01)
*H01L 21/265* (2006.01)

(52) U.S. Cl.
CPC ...... *H01L 29/7811* (2013.01); *H01L 29/7813* (2013.01); *H01L 21/26586* (2013.01)

SEMICONDUCTOR DEVICE HAVING A FIELD ELECTRODE AND A GATE ELECTRODE IN A TRENCH STRUCTURE AND MANUFACTURING METHOD

BACKGROUND

In a variety of semiconductor power applications, insulated gate field effect transistors (IGFETs), for example metal oxide semiconductor field effect transistors (MOSFETs) are used to switch electric loads on and off. Transistor cell concepts including gate electrode and gate dielectric in trenches may allow for a reduction of an area-specific on-resistance (Ron×A) due to higher packing density of the transistor cells compared with planar cell concepts. By further accommodating one or more field electrodes or field plates in the trenches a trade-off relationship between breakdown voltage and on-resistance may be further improved. Charge compensation by the field plates in an edge termination area may interact with an electric field distribution due to an edge termination construction of the body region. The interaction may limit a breakdown voltage margin of the device.

Hence, it is desirable to further improve the trade-off relationship between breakdown voltage and on-resistance in field plate trench IGFETs.

SUMMARY

The present disclosure relates to a semiconductor device comprising a semiconductor substrate of a first conductivity type and a semiconductor layer of the first conductivity type on the semiconductor substrate. A trench structure extends into the semiconductor body from a first surface. The trench structure comprises a gate electrode and at least one field electrode arranged between the gate electrode and a bottom side of the trench structure. A body region of the second conductivity type adjoins the trench structure. The body region laterally extends from a transistor cell area into an edge termination area, wherein a pn junction is formed between the body region and the semiconductor layer. A doping concentration of at least one of the body region and the semiconductor layer is lowered at a lateral end of the pn junction in the edge termination area compared to a doping concentration of the at least one of the body region and the semiconductor layer at the pn junction in the transistor cell area.

The present disclosure also relates to a method of manufacturing a semiconductor device. The method comprises forming a semiconductor layer of a first conductivity type on a semiconductor substrate of the first conductivity type. The method further comprises forming a trench structure extending into the semiconductor body from a first surface, the trench structure comprising a gate electrode and at least one field electrode arranged between the gate electrode and a bottom side of the trench structure. The method further comprises forming a body region of the second conductivity type adjoining the trench structure, wherein the body region laterally extends from a transistor cell area into an edge termination area. The method further comprises locally increasing a breakdown voltage of a pn junction between the body region and the semiconductor layer in the edge termination area compared to the transistor cell area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n"$^+$-doping region has a higher doping concentration than an "n"-doping region. Doping regions of the same relative doping concentration do not necessarily have the same absolute doping concentration. For example, two different "n"-doping regions may have the same or different absolute doping concentrations.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

Figure 1A:
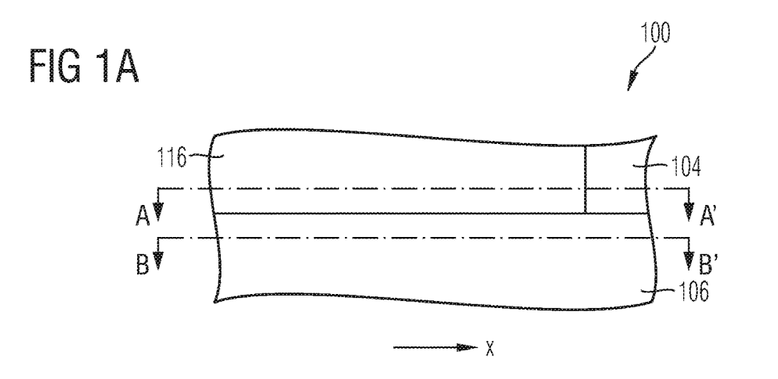
FIGS. 1A to 1C are top and cross-sectional views of a semiconductor body for illustrating a semiconductor device comprising a gate electrode and a field electrode in a trench.
Figure 1B:
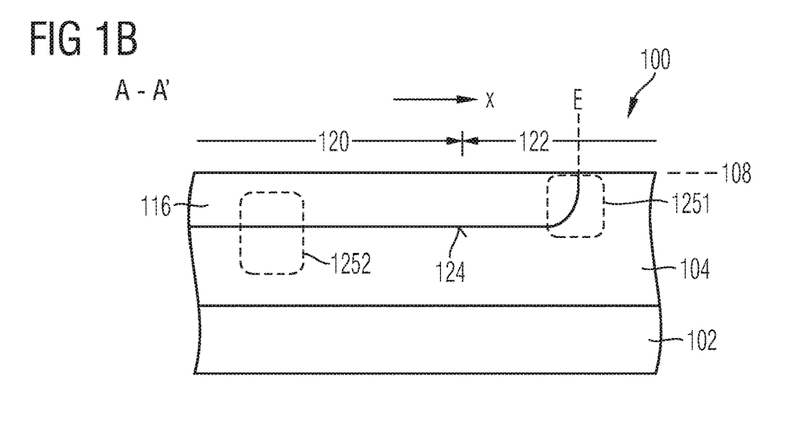
Figure 1C:
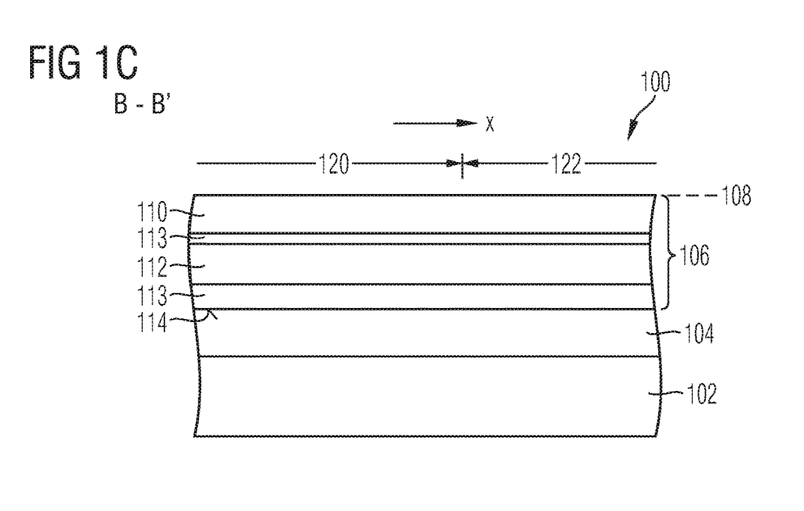

FIG. 1A is a schematic top view of a semiconductor body portion 100 for illustrating one or more embodiments. FIGS. 1B, 1C are a schematic cross-sectional view along cut lines A-A', B-B' of FIG. 1A.

Referring to the top view of FIG. 1A and the cross-sectional views of FIGS. 1B, 1C the semiconductor body portion 100 includes a semiconductor substrate 102 of a first conductivity type and a semiconductor layer 104 of the first conductivity type on the semiconductor substrate 102. A trench structure 106 extends into the semiconductor body portion 100 from a first surface 108. The trench structure 106 comprises a gate electrode 110 and at least one field electrode 112 arranged between the gate electrode 110 and a bottom side 114 of the trench structure 106. A body region 116 of the second conductivity type adjoins the trench structure 106. The body region 116 laterally extends from a transistor cell area 120 into an edge termination area 122. A pn junction 124 is between the body region 116 and the semiconductor layer 104. A doping concentration of at least one of the body region 116 and the semiconductor layer 104 is lowered at a lateral end E of the pn junction 124 in the edge termination area 122, for example in a first part 1251 compared to a doping concentration of the at least one of the body region 116 and the semiconductor layer 104 at the pn junction 124 in the transistor cell area 120, for example in a second part 1252.

An insulating structure 113 in the trench electrically insulates the gate electrode 110 and the field electrode 112 from one another, and further electrically insulates the gate electrode 110 from a surrounding part of the semiconductor body portion 100 as well as the field electrode 112 from a surrounding part of the semiconductor body portion 100. The insulating structure 113 may include two or even more insulating layers formed in separate layer formation processes, for example a field dielectric arranged between the field electrode 112 and a surrounding part of the semiconductor body portion 100 and a gate dielectric arranged between the gate electrode 110 and a surrounding part of the semiconductor body portion 100. In one or more embodiments, the gate dielectric comprises or is made of a thermal oxide layer and the field dielectric comprises or is made of a deposited oxide layer. In one or more embodiments, the insulating structure 113 may include one or multiple stacked insulating materials, for example one or a combination of oxides such as $SiO_2$ as thermal oxide, oxides deposited by chemical vapor deposition (CVD) processes such as low-pressure (LP) CVD oxides, for example borophosphosilicate glass (BPSG), phosphosilicate glass (PSG), borosilicate glass (BSG), nitride(s), low- and high-dielectrics, and any combination of these or other insulating materials.

In one or more embodiments, the semiconductor substrate 102 is a silicon semiconductor body, for example a silicon semiconductor substrate such as a silicon (Si) semiconductor wafer. Other substrate materials than silicon, for example silicon carbide (SiC), gallium arsenide (GaAs), gallium nitride (GaN) or other $A_{III}B_V$ compound semiconductors, germanium (Ge) or silicon germanium (SiGe) may alternatively be used as substrate material.

In the embodiment illustrated in FIGS. 1A to 1C, one field electrode 112 in the trench structure 106 is illustrated. In other embodiments, more than one field electrode, for example two, three, four or even more field electrodes may be arranged in the trench structure 106, for example consecutively arranged along a vertical direction perpendicular to the first surface 108 and electrically insulated from each other by the insulating structure 113, for example. A number of field electrodes arranged in the trench structure 106 may depend on a specified voltage class of the IGFET, for example. The field electrode 112 may be electrically coupled to source potential, for example, or may be electrically coupled to another reference potential configured to cause charge compensation. When arranging two or more field electrodes in the trench structure 106, the field electrodes may be electrically coupled to different potentials, for example set by a voltage divider that may be based on resistors and/or diodes, for example.

Figure 2:
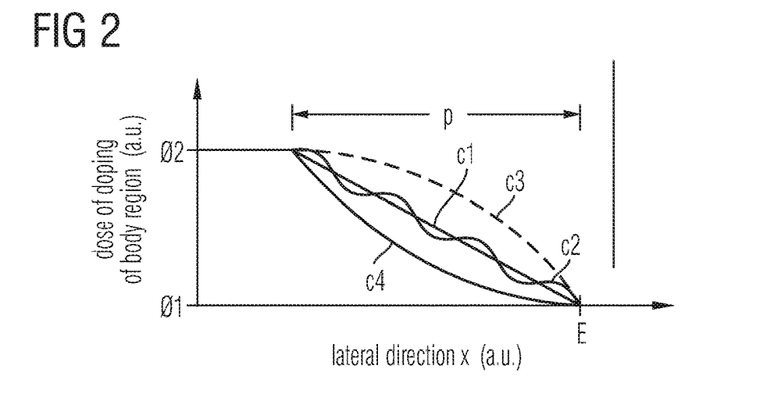
FIG. 2 is a graph for illustrating dilutions of dose of doping of a body region toward a lateral end of a pn junction in an edge termination area.

Referring to the schematic graph of FIG. 2, exemplary doses of doping of the body region 116 are illustrated versus the lateral direction x toward the lateral end E of the pn junction 124. The dose of doping increases from a first value $\Phi 1$ at the lateral end E of the pn junction 124 in the edge termination area 122 to a second value $\Phi 2$ along a lateral path p ranging from 0.5 μm to 10 μm toward the transistor cell area, for example depending on a voltage class of the device. Different from lateral diffusion profiles of implanted body wells, dilution of the dose of the body region along the path p requires measures for body dose dilution along the path p, for example measures regarding varying degree of mask coverage or varying mask blocking degree. In one or more embodiments the first value Φ1 is in a range from 10% to 80% of the second value Φ2. The dose of doping of the body region corresponds to the number of dopants of the body region per unit area measured for all depths, for example number of dopants per $cm^{-2}$, or, in other words, corresponds to the integral of the body doping concentration along a vertical extension of the body region. The second value Φ2 may correspond to the dose of doping of the body region in the transistor cell area, for example.

Referring to the graph illustrated in FIG. 2, a profile of doses of doping of the body region may depend on a specific measure taken for diluting the dose along the path p, and may constantly increase as is illustrated with reference to curve c1, or may stepwise increase as is illustrated with reference to curve c2, or may have a convex or concave shape as is illustrated with reference to curves c3, c4. Other profiles may be realized as well as any combination of the profiles illustrated in FIG. 2.

Figure 3A:
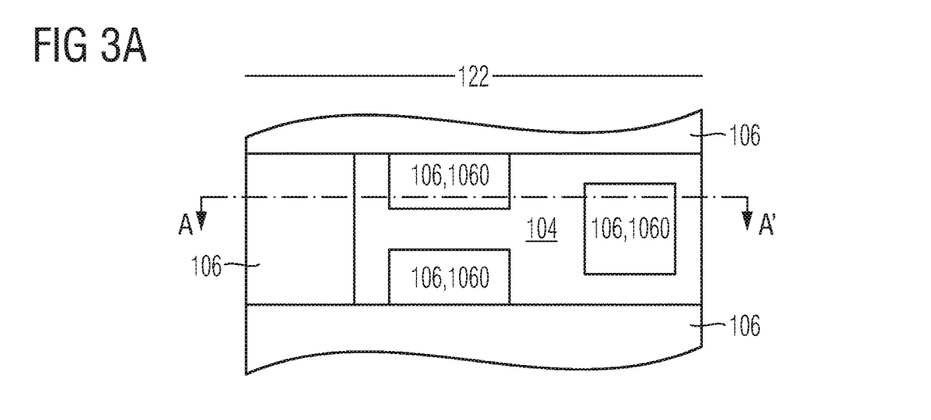
FIGS. 3A and 3B are top and cross-sectional views of a semiconductor body for illustrating floating body region parts in the edge termination area.
Figure 3B:
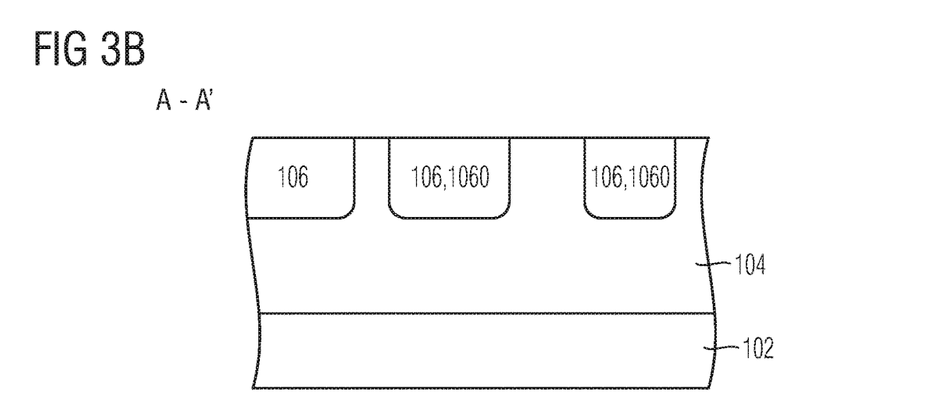

Referring to the schematic top and cross-sectional views of FIGS. 3A, 3B, in one or more embodiments, the body region 116 comprises body sub-regions 1160 laterally spaced apart from one another in the edge termination area 122. A pattern of the body sub-regions 1160 may be adapted to a target body dose profile toward the lateral end E of the pn junction, for example. Thus, number, shape, distance, dimension of the body sub-regions may vary among one another to set a target profile of dose of doping of the body region, for example.

Figure 4A:
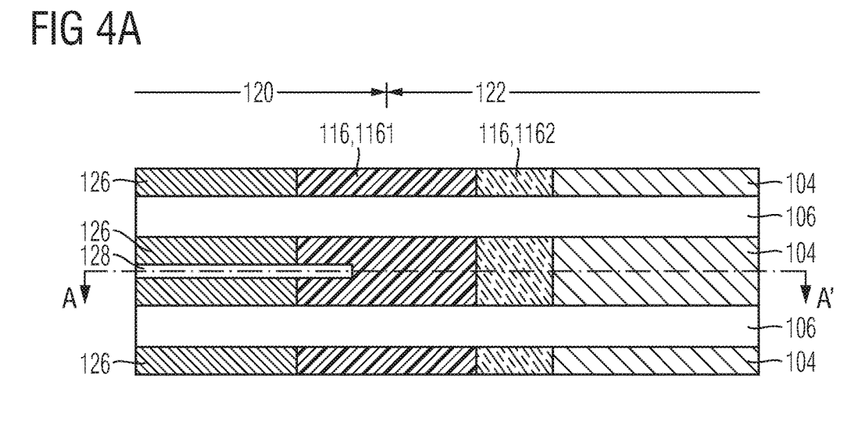
FIGS. 4A and 4B are top and cross-sectional views of a semiconductor body for illustrating body sub-regions laterally protruding from another body sub-region in the edge termination area.
Figure 4B:
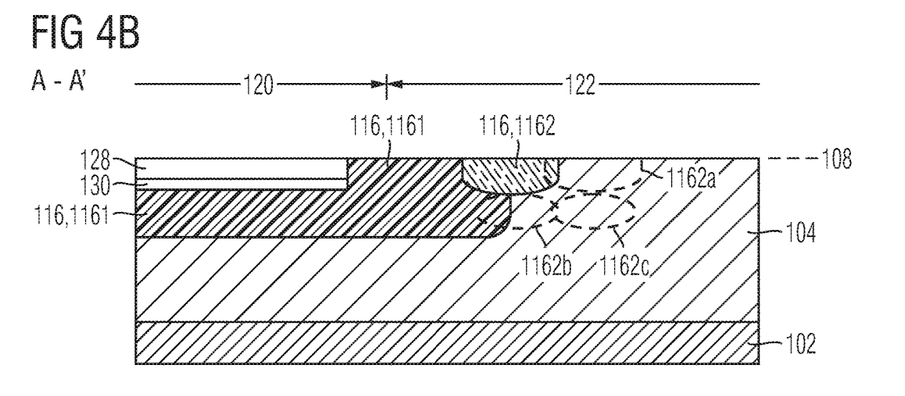

Referring to the schematic top and cross-sectional views of FIGS. 4A, 4B, in one or more embodiments, the body region 116 comprises a first body sub-region 1161 extending from the transistor cell area 120 into the edge termination area 122. The body region 116 further comprises a second body sub-region 1162 in the edge termination area 122. The second body sub-region laterally protrudes from the first body sub-region 1161, and a maximum doping concentration of the second body sub-region 1162 is smaller than a maximum doping concentration of the first body sub-region 1161. In the embodiment illustrated in FIGS. 4A, 4B, the second body sub-region 1162 adjoins the first surface 108. In other words, the second body sub-region 1162 is formed as a doped semiconductor well. In one or more other embodiments, the second body sub-region 1162 may also be laterally spaced apart from the first body sub-region 1161, for example as indicated in FIG. 4B by a second body sub-region 1162a. In one or more other embodiments, the second body sub-region 1162 may also be buried below the first surface 108, for example as indicated in FIG. 4B by a buried second body sub-region 1162b. In one or more other embodiments, the second body sub-region 1162 may also be buried below the first surface 108 and laterally spaced apart from the first body sub-region 1161, for example as indicated in FIG. 4B by a buried second body sub-region 1162c. A source region 126 of the first conductivity type may adjoin the first surface 108. The source region 126 and the body region 116 may be electrically connected to a source contact 128. A highly doped body contact region 130 of the second conductivity type may be arranged between the body region 116 and the source contact 128 for the purpose of improving or achieving an ohmic contact between the source contact 128 and the body region 116, for example. In the embodiment illustrated in FIGS. 4A, 4B, the source contact 128 is illustrated as a groove contact. In some other embodiments, the source contact 128 may be realized as a contact plug providing electric contact to each of the body region 116 and the source region 126, for example.

Figure 5:
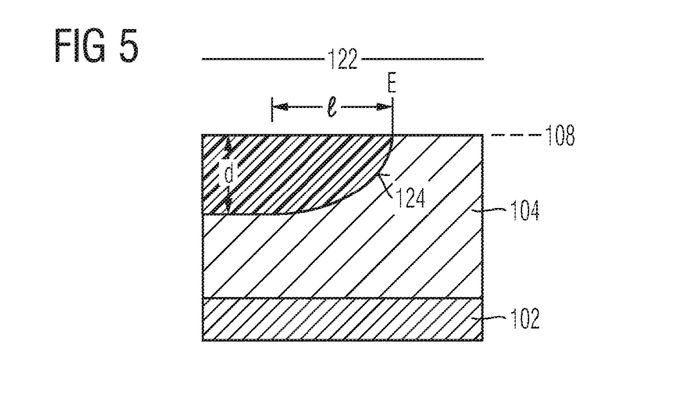
FIG. 5 is a schematic cross-sectional view of a semiconductor body for illustrating an increase of a vertical extension of the body region in the edge termination area.

Referring to the schematic cross-sectional view of FIG. 5, in one or more embodiments, a vertical extension of the body region 116 increases over a lateral extension l from 0 μm at the lateral end E of the pn junction 124 in the edge termination area 122 where the pn junction 124 adjoins the first surface 108 to a depth d at a position where a vertical extension of the body region 116 continues to be constant, and a ratio between l and d ranges from 1 to 5.

Figure 6A:
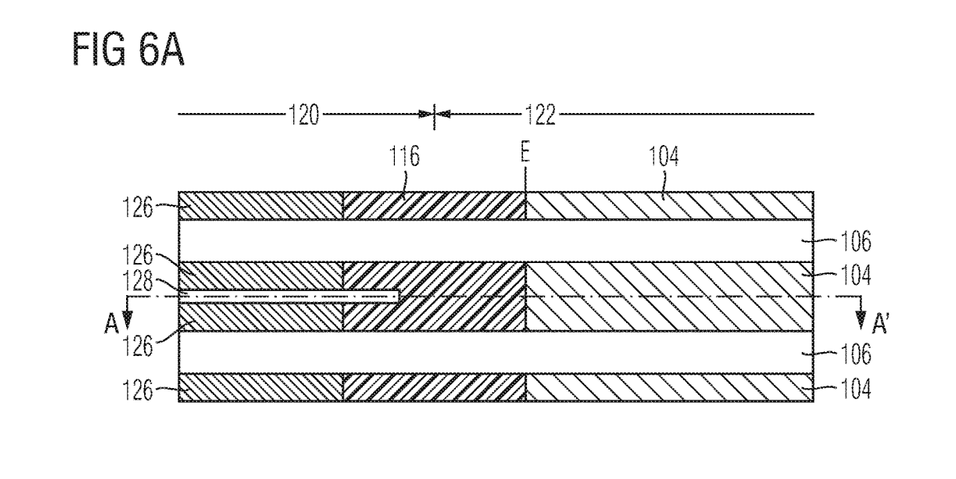
FIGS. 6A and 6B and 7A to 7D are top and cross-sectional views of a semiconductor body for illustrating semiconductor devices comprising a pn junction between a body region and different semiconductor sub-layers.
Figure 6B:
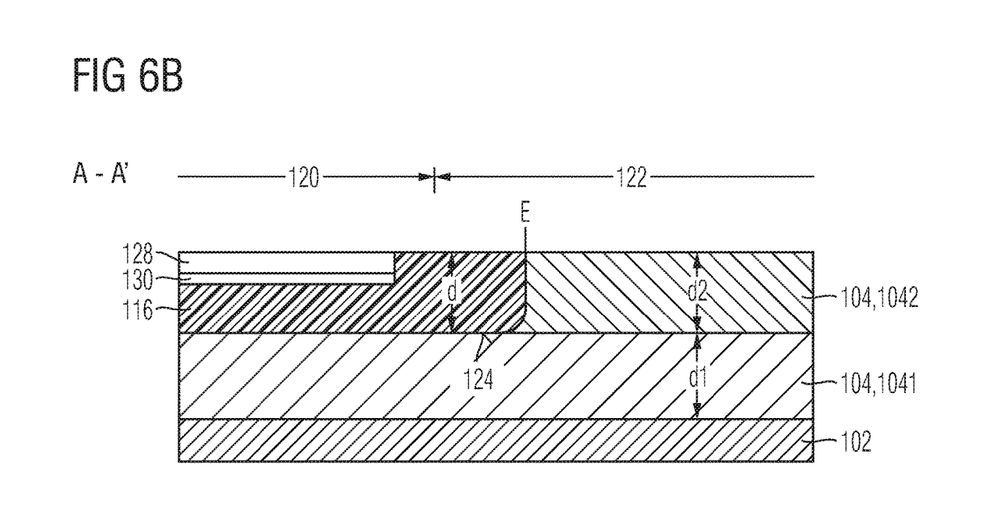

Referring to the schematic to the schematic top and cross-sectional views of FIGS. 6A, 6B, in one or more embodiments, the semiconductor layer 104 comprises a first semiconductor sub-layer 1041 on the semiconductor substrate 102 and a second semiconductor sub-layer 1042 on the first semiconductor sub-layer 1041. An average doping concentration in the first semiconductor sub-layer 1041 is larger than an average doping concentration in the second semiconductor sub-layer 1042. This may allow for a local increase of the source to drain breakdown voltage in the edge termination area 122, for example.

In one or more embodiments, a doping concentration in the first semiconductor sub-layer 1041 is in a range from $1\times10^{16}$ $cm^{-3}$ to $8\times10^{16}$ $cm^{-3}$, a vertical extension d1 of the first semiconductor sub-layer 1041 is in a range from 0.5 μm to 10 μm, a doping concentration in the second semiconductor sub-layer 1042 is in a range from $10^{14}$ $cm^{-3}$ to $2\times10^{16}$ $cm^{-3}$, and a vertical extension d2 of the second semiconductor sub-layer 1042 is in a range from 0.1 μm to 2 μm. In the embodiment illustrated in FIG. 6B, the vertical extension d2 of the second semiconductor sub-layer 1042 is equal to or almost equal, for example differing by +/−300 nm, to a vertical extension d of the body region 116. In one or more other embodiments, the vertical extension d2 of the second semiconductor sub-layer 1042 may be smaller than the vertical extension d of the body region 116. In one or more other embodiments, the vertical extension d2 of the second semiconductor sub-layer 1042 is larger by at most 300 nm than the vertical extension d of the body region 116. The embodiment illustrated in FIGS. 6A and 6B may allow for a local increase of the source to drain breakdown voltage in the edge termination area 122 due to the smaller doping concentration of the second semiconductor sub-layer 1042 at the lateral end E of the pn junction 124 compared to the doping concentration of the first semiconductor sub-layer 1041 at the pn junction 124 in the transistor cell area 120, for example.

In one or more further embodiments illustrated in the schematic top and cross-sectional views of FIGS. 7A, 7B, 7C, 7D, the vertical extension d2 of the second semiconductor sub-layer 1042 is larger than the vertical extension d of the body region 116, and, to counteract any negative impact of the comparatively low doped second semiconductor sub-layer 1042 on the on-state resistance in the transistor cell area 120, a pinning region 132 of the first conductivity type is arranged in the transistor cell area 120 between the body region 116 and the first semiconductor sub-layer 1041. A doping concentration of the pinning region 132 is larger than a doping concentration of the second semiconductor sub-layer 1042. A lateral extension of the body region 116 along the lateral direction x from the transistor cell area 120 to the edge termination area 122 is larger than a lateral extension of the pinning region 132.

In one or more embodiments, a lateral extension of the pinning region 132 is limited to the transistor cell area 120.

Figure 7A:
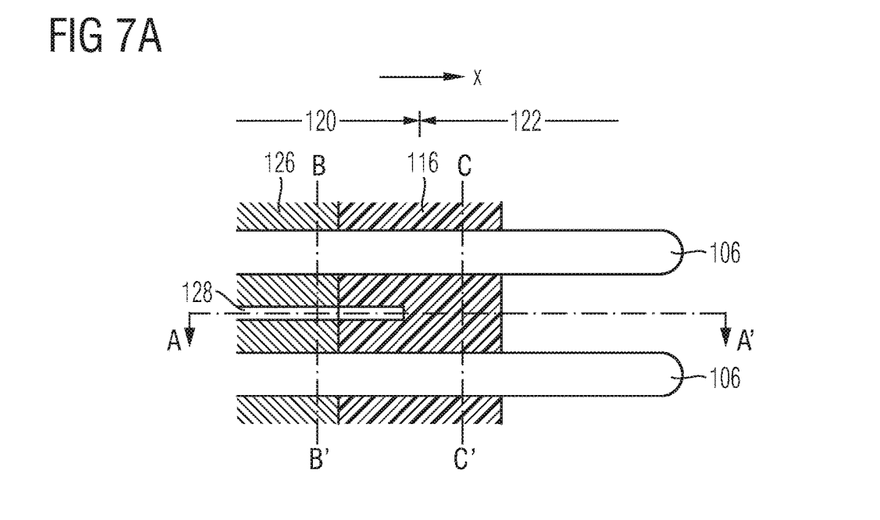
Figure 7B:
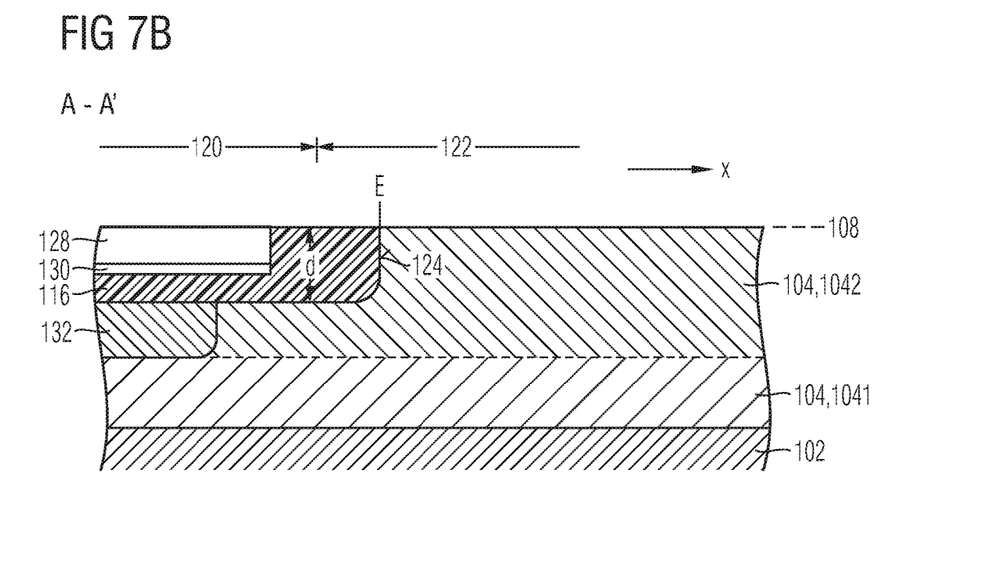
Figure 7C:
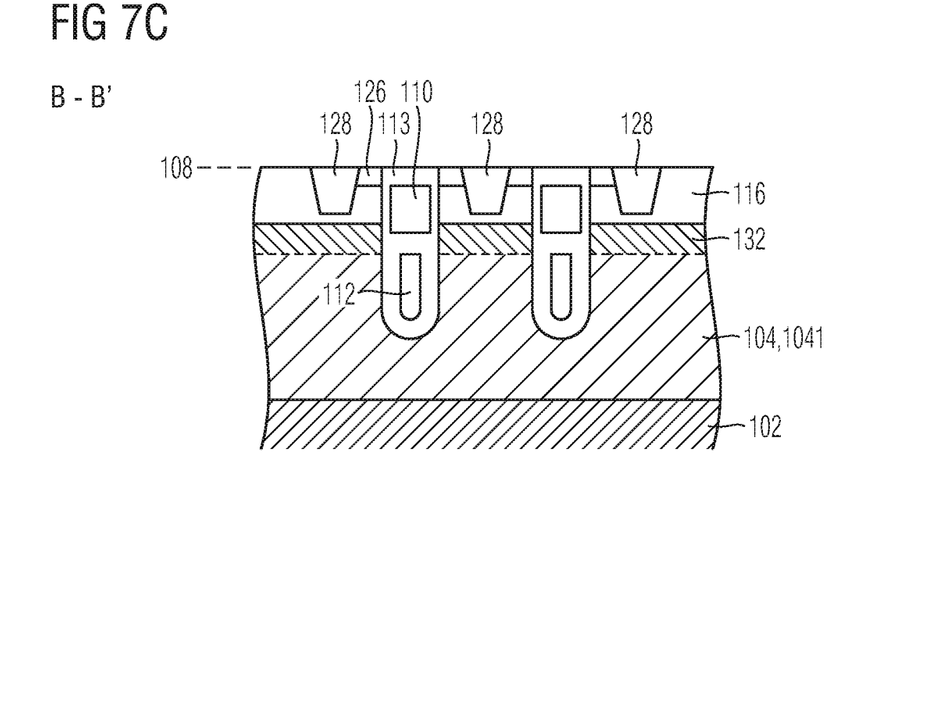
Figure 7D:
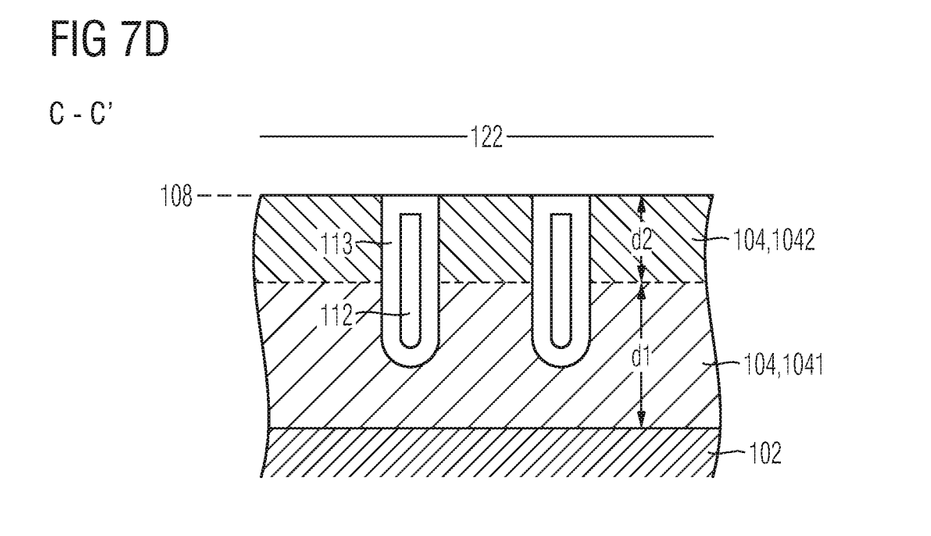

Referring to the schematic cross-sectional view of FIG. 7D, the field electrode 112 in the edge termination area 122 may be expanded toward the first surface 108, e.g. for contact purposes, compared to the arrangement of the field electrode 112 in the transistor cell area 120 illustrated in FIG. 7C, for example by omitting the gate electrode 110 and a gate dielectric in the edge termination area 122 and, instead, continuing with the field electrode 112 and a field dielectric along the lateral direction x. This change in electrode arrangement may occur at or around a transition between the transistor cell area 120 and the edge termination area 122, for example.

The embodiment illustrated in FIGS. 7A to 7D may allow for a local increase of the source to drain breakdown voltage in the edge termination area 122 compared to the transistor cell area 120 caused by a local increase of doping due to the pinning region 132 at the pn junction 124 in the transistor cell area 120, and further caused by a local decrease of the doping concentration at the lateral end E of the pn junction 124 due to the first semiconductor sub-layer 1041, for example.

In one or more embodiments, the semiconductor device illustrated in FIGS. 1A to 7D is a vertical insulated gate field effect transistor, and further comprises a source electrode electrically connected to the source region 126 at the first surface 108 of the semiconductor body, and a drain electrode electrically connected to the semiconductor substrate 102 at a second surface of the semiconductor body opposite to the first surface 108.

Figure 8:
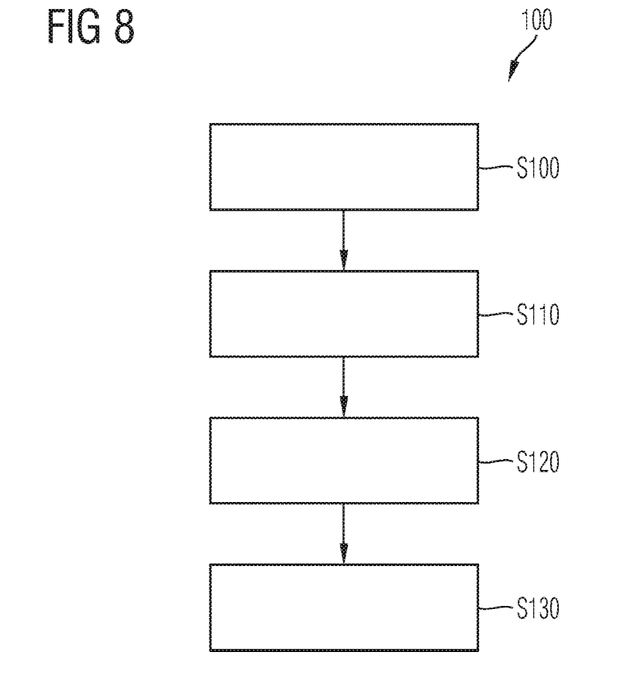
FIG. 8 is a schematic flow-chart for illustrating a method of manufacturing a semiconductor device.

FIG. 8 is a schematic flow-chart for illustrating a method 1000 of manufacturing a semiconductor device.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases. Details provided with reference to material characteristics of layers described above with reference to FIGS. 1A to 7D apply likewise.

Referring to FIG. 8, process feature S100 comprises forming a semiconductor layer of a first conductivity type on a semiconductor substrate of the first conductivity type. The semiconductor layer may be formed by a layer deposition process, for example chemical vapor deposition (CVD) such as low pressure CVD (LPCVD) or atmospheric pressure CVD (APCVD) of silicon on a silicon substrate. The semiconductor layer may be doped in-situ and/or by ion implantation and activation, for example.

Process feature S110 comprises forming a trench structure extending into the semiconductor body from a first surface, the trench structure comprising a gate electrode and at least one field electrode arranged between the gate electrode and a bottom side of the trench structure. A trench may be formed in the semiconductor body by an anisotropic etch process, for example by reactive ion etching (RIE). An insulating structure lining walls of the trench may be formed by one or multiple stacked insulating materials, for example one or a combination of oxides such SiO2 as thermal oxide, oxides deposited by chemical vapor deposition (CVD) processes such as low-pressure (LP) CVD oxides, for example borophosphosilicate glass (BPSG), phosphosilicate glass (PSG), borosilicate glass (BSG), nitride(s), low- and high-dielectrics, and any combination of these or other insulating materials. The dielectric structure may act as a field dielectric at a bottom part of the trench structure. One or more field electrodes may be formed, for example by deposition of a conductive material, for example highly doped polycrystalline silicon. Likewise, a gate electrode may be formed. Between processes of forming the gate or field electrodes, the dielectric structure may be enlarged for electrically insulating respective electrodes from one another and from a surrounding part of the semiconductor body, for example. A part of the dielectric structure formed between the gate electrode and the semiconductor body may be a gate dielectric, for example a thermal oxide. The field electrode(s) may be electrically connected at a lateral end of the trench structure, for example by interrupting the gate electrode and expanding the field electrode to a surface of the semiconductor body where a contact plug may provide electric connection, for example.

Process feature S120 comprises forming a body region of the second conductivity type adjoining the trench structure, wherein the body region laterally extends from a transistor cell area into an edge termination area. The body region may be formed by ion implantation of dopants and activation.

Process feature S130 comprises locally increasing a breakdown voltage of a pn junction between the body region and the semiconductor layer in the edge termination area compared to the transistor cell area. Process feature S130 may include measures that are part of process feature S120 and/or process feature S110, for example.

In one or more embodiments locally increasing the breakdown voltage comprises lowering a doping concentration of at least one of the body region and the semiconductor layer at a lateral end of the pn junction in the edge termination area compared to a doping concentration of the at least one of the body region and the semiconductor layer at the pn junction in the transistor cell area.

Figure 9:
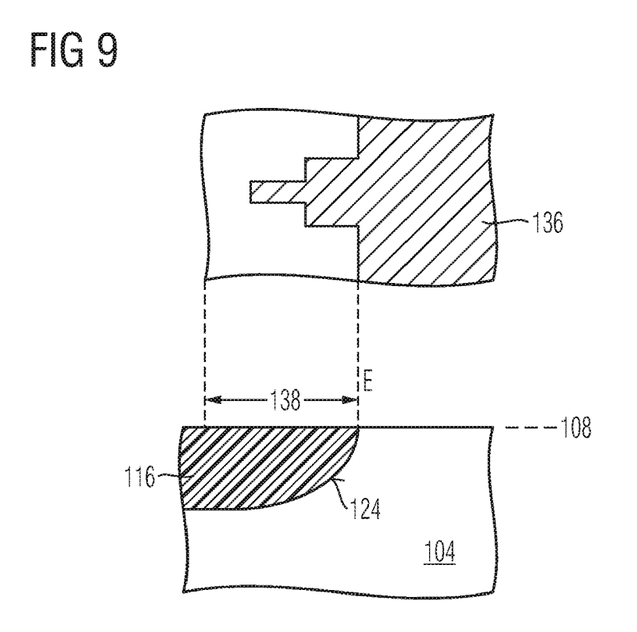
FIG. 9 is a schematic view for illustrating a dilution of the body implant dose by increasing a coverage portion of a body mask.

Referring to the schematic view of FIG. 9, the body region 116 may be formed by ion implantation and activation, and a body implant dose may be diluted toward the lateral end E of the pn junction 124 by increasing a coverage portion of a body mask 136 toward the lateral end E of the pn junction 124. This may result in a diluted body area 138 having a lower curvature of the pn junction 124 and a lower doping concentration compared to a body region formed without dilution of the body implant dose toward the lateral end E of the pn junction 124, and, hence to a local increase of a drain to source breakdown voltage in the edge termination are where the lateral end E of the pn junction is located.

In one or more embodiments, forming the body region comprises forming a first body sub-region extending from the transistor cell area to the edge termination area, and further comprises forming a second body sub-region in the edge termination area, wherein the second body sub-region laterally protrudes from the first body sub-region, and a maximum doping concentration of the second body sub-region is set smaller than a maximum doping concentration of the first body sub-region. Examples of laterally protruding sub-regions are illustrated in FIGS. 4A, 4B, for example.

Figure 10:
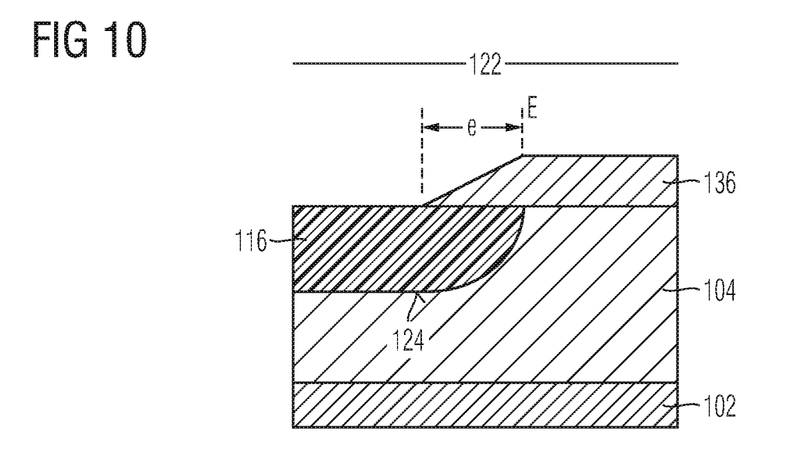
FIG. 10 is a schematic view for illustrating a dilution of the body implant dose by forming a tapered body implant mask.

Referring to the schematic cross-sectional view of FIG. 10, in one or more embodiments, the body region 116 is formed by ion implantation and activation, and a part of the body mask 136 for ion implantation is formed as a tapered body mask portion at the lateral end E of the pn junction 124 in the edge termination area 122. A lateral extension e of the tapered body mask portion may be set in a range from 0.5 µm to 10 µm.

Figure 11:
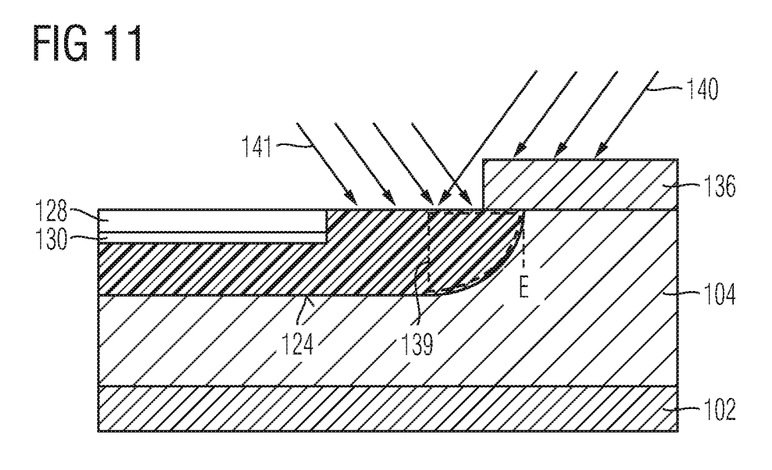
FIG. 11 is a schematic view for illustrating a dilution of the body implant dose by implanting body dopant ions in dual- or quad-mode.

Referring to the schematic cross-sectional view of FIG. 11, the body region 116 is formed by tilted dual-mode ion implantation and activation. In an area 139 around the lateral end E of the pn junction 124 where dopant ions implanted along direction 141 enter the semiconductor body, dopant ions implanted along direction 140 may be blocked by the body mask 136. This may allow for achieving a dilution of the overall body implant dose toward the lateral end of the pn junction 124. The ion implantation may also be carried out as a quad-mode ion implantation, for example.

In one or more embodiments, forming the semiconductor layer comprises forming a first semiconductor sub-layer on the semiconductor substrate and forming a second semiconductor sub-layer on the first semiconductor sub-layer, wherein an average doping concentration in the first semiconductor sub-layer is larger than an average doping concentration in the second semiconductor sub-layer. Examples of first and second semiconductor sub-layers are illustrated in FIGS. 6A, 6B, and 7A to 7D, for example.

In one or more embodiments, for example as is illustrated in FIGS. 7A to 7D, a vertical extension d2 of the second semiconductor sub-layer 1042 is set larger than a vertical extension d of the body region 116. Further, a pinning region 132 of the first conductivity type is formed in the transistor cell area 120 between the body region 116 and the first semiconductor sub-layer 1041, wherein a doping concentration of the pinning region 132 is set larger than a doping concentration of the second semiconductor sub-layer 1042.

In one or more embodiments, a source region is formed by ion implantation and activation, wherein one and the same ion implantation mask is used for implanting dopants of the source region and the pinning region.

In the embodiments described above the semiconductor substrate 102 may be $n^+$-doped, the semiconductor layer 104 may be $n^-$-doped, the first semiconductor sub-layer 1041 may be $n^-$-doped, the second semiconductor sub-layer 1042 may be $n^{--}$-doped, the source region 126 may be $n^+$-doped, the pinning region 132 may be n-doped, the body region 116 may be p-doped, the body contact region 130 may be $p^+$-doped. Likewise, the semiconductor substrate 102 may be $p^+$-doped, the semiconductor layer 104 may be $p^-$-doped, the first semiconductor sub-layer 1041 may be $p^-$ doped, the second semiconductor sub-layer 1042 may be $p^{--}$-doped, the source region 126 may be $p^+$-doped, the pinning region 132 may be p-doped, the body region 116 may be n-doped, the body contact region 130 may be $n^+$-doped.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor body comprising a semiconductor substrate of a first conductivity type and a semiconductor layer of the first conductivity type on the semiconductor substrate;
    a trench structure extending into the semiconductor body from a first surface, the trench structure comprising a gate electrode and at least one field electrode arranged between the gate electrode and a bottom side of the trench structure; and
    a body region of a second conductivity type adjoining the trench structure, the body region laterally extending from a transistor cell area into an edge termination area, wherein a pn junction is formed between the body region and the semiconductor layer,
    wherein a doping concentration of at least one of the body region and the semiconductor layer is lowered at a lateral end of the pn junction in the edge termination area compared to a doping concentration of the at least one of the body region and the semiconductor layer at the pn junction in the transistor cell area.

2. The semiconductor device of claim 1, wherein a dose of doping of the body region increases from a first value at the lateral end of the pn junction in the edge termination area to a second value along a lateral path ranging from 0.5 μm to 10 μm toward the transistor cell area.

3. The semiconductor device of claim 2, wherein the first value is in a range from 10% to 80% of the second value.

4. The semiconductor device of claim 2, wherein the second value corresponds to the dose of doping of the body region in the transistor cell area.

5. The semiconductor device of claim 2, wherein the body region comprises body sub-regions laterally spaced apart from one another in the edge termination area.

6. The semiconductor device of claim 1, wherein the body region comprises:
    a first body sub-region extending from the transistor cell area into the edge termination area; and
    a second body sub-region in the edge termination area,
    wherein a maximum doping concentration of the second body sub-region is smaller than a maximum doping concentration of the first body sub-region.

7. The semiconductor device of claim 6, wherein at least one of: the second body sub-region laterally protrudes from the first body sub-region; the second body sub-region and the first body sub-region are laterally spaced apart from one another; the second body sub-region adjoins the first surface; and the second body sub-region is buried below the first surface.

8. The semiconductor device of claim 1, wherein a vertical extension of the body region increases over a lateral extension l from 0 μm at the lateral end of the pn junction in the edge termination area where the pn junction adjoins the first surface to a depth d at a position where a vertical extension of the body region continues to be constant, and wherein a ratio between l and d ranges from 1 to 5.

9. The semiconductor device of claim 1, wherein the semiconductor layer comprises:
    a first semiconductor sub-layer on the semiconductor substrate; and
    a second semiconductor sub-layer on the first semiconductor sub-layer,
    wherein an average doping concentration of the first semiconductor sub-layer is larger than an average doping concentration of the second semiconductor sub-layer.

10. The semiconductor device of claim 9, further comprising:
    a pinning region of the first conductivity type arranged in the transistor cell area between the body region and the first semiconductor sub-layer,
    wherein a vertical extension of the second semiconductor sub-layer is larger than a vertical extension of the body region,
    wherein a doping concentration of the pinning region is larger than a doping concentration of the second semiconductor sub-layer,
    wherein a lateral extension of the body region along a lateral direction from the transistor cell area to the edge termination area is larger than a lateral extension of the pinning region.

11. The semiconductor device of claim 10, wherein a lateral extension of the pinning region is limited to the transistor cell area.

12. The semiconductor device of claim 1, wherein the semiconductor device is a vertical insulated gate field effect transistor comprising a source electrode electrically connected to a source region at the first surface of the semiconductor body, and a drain electrode electrically connected to the semiconductor substrate at a second surface of the semiconductor body opposite to the first surface.

13. A method of manufacturing a semiconductor device, the method comprising:
   forming a semiconductor layer of a first conductivity type on a semiconductor substrate of the first conductivity type;
   forming a trench structure extending into the semiconductor layer from a first surface, the trench structure comprising a gate electrode and at least one field electrode arranged between the gate electrode and a bottom side of the trench structure;
   forming a body region of the second conductivity type adjoining the trench structure, the body region laterally extending from a transistor cell area into an edge termination area; and
   generating a doping profile in at least one of the body region and the semiconductor layer, the doping profile including a doping concentration of at least one of the body region and the semiconductor layer being lower at a lateral end of a pn junction between the body region and the semiconductor layer in the edge termination area compared to a doping concentration of the at least one of the body region and the semiconductor layer at the pn junction in the transistor cell area.

14. The method of claim 13, wherein the body region is formed by ion implantation and activation, and wherein a body implant dose is diluted toward the lateral end of the pn junction by increasing a body mask coverage portion toward a lateral end of the pn junction.

15. The method of claim 13, wherein forming the body region comprises:
   forming a first body sub-region extending from the transistor cell area into the edge termination area; and
   forming a second body sub-region in the edge termination area,
   wherein a maximum doping concentration of the second body sub-region is set smaller than a maximum doping concentration of the first body sub-region.

16. The method of claim 13, wherein at least one of: the second body sub-region is formed to laterally protrude from the first body sub-region; the second body sub-region and the first body sub-region are formed to be laterally spaced apart from one another; the second body sub-region is formed to adjoin the first surface; and the second body sub-region is formed to be buried below the first surface.

17. The method of claim 13, wherein the body region is formed by ion implantation and activation, and wherein a part of the body mask for ion implantation is formed as a tapered body mask portion at a lateral end of the pn junction in the edge termination area.

18. The method of claim 13, wherein the body region is formed by tilted dual-mode or quad-mode ion implantation and activation.

19. The method of claim 13, wherein forming the semiconductor layer comprises:
   forming a first semiconductor sub-layer on the semiconductor substrate; and
   forming a second semiconductor sub-layer on the first semiconductor sub-layer,
   wherein an average doping concentration in the first semiconductor sub-layer is larger than an average doping concentration in the second semiconductor sub-layer.

20. The method of claim 19, wherein a vertical extension of the second semiconductor sub-layer is set equal to or smaller than a vertical extension of the body region.

21. The method of claim 19, further comprising:
   forming a pinning region of the first conductivity type in the transistor cell area between the body region and the first semiconductor sub-layer,
   wherein a vertical extension of the second semiconductor sub-layer is set larger than a vertical extension of the body region,
   wherein a doping concentration of the pinning region is set larger than a doping concentration of the second semiconductor sub-layer.

22. The method of claim 21, further comprising:
   forming a source region by ion implantation and activation,
   wherein one and the same ion implantation mask is used for implanting dopants of the source region and the pinning region.

* * * * *